(12) United States Patent
Choi

(10) Patent No.: US 9,093,410 B2
(45) Date of Patent: Jul. 28, 2015

(54) DISPLAY APPARATUS AND METHOD OF MANUFACTURING THE SAME

(71) Applicant: SAMSUNG DISPLAY CO., LTD., Yongin, Gyeonggi-do (KR)

(72) Inventor: Sung-Hwan Choi, Yongin (KR)

(73) Assignee: Samsung Display Co., Ltd. (KR)

( * ) Notice: Subject to any disclaimer, the term of this patent is extended or adjusted under 35 U.S.C. 154(b) by 115 days.

(21) Appl. No.: 14/041,969

(22) Filed: Sep. 30, 2013

(65) Prior Publication Data

US 2014/0342478 A1    Nov. 20, 2014

(30) Foreign Application Priority Data

May 16, 2013    (KR) .................. 10-2013-0055843

(51) Int. Cl.
| | | |
|---|---|---|
| H01L 27/32 | (2006.01) | |
| G02F 1/1362 | (2006.01) | |
| H01L 27/12 | (2006.01) | |
| H01L 29/417 | (2006.01) | |
| H01L 29/49 | (2006.01) | |
| H01L 51/56 | (2006.01) | |

(52) U.S. Cl.
CPC ...... *H01L 27/3279* (2013.01); *G02F 1/136286* (2013.01); *H01L 27/124* (2013.01); *H01L 27/1214* (2013.01); *H01L 27/3248* (2013.01); *H01L 27/3262* (2013.01); *H01L 27/3276* (2013.01); *H01L 29/41733* (2013.01); *H01L 29/4908* (2013.01); *H01L 51/56* (2013.01)

(58) Field of Classification Search
CPC ............. H01L 27/124; H01L 27/3262; H01L 27/3276; H01L 27/1214; H01L 27/3279; H01L 51/56; H01L 29/41733; H01L 29/4908; H01L 27/3248

See application file for complete search history.

(56) References Cited

U.S. PATENT DOCUMENTS

| | | | |
|---|---|---|---|
| 7,061,565 B2 | 6/2006 | Kwon et al. | |
| 7,177,003 B2 | 2/2007 | Kim | |
| 7,767,478 B2 | 8/2010 | Lee et al. | |

(Continued)

FOREIGN PATENT DOCUMENTS

| | | |
|---|---|---|
| JP | 2008-311283 A | 12/2008 |
| JP | 2011-232654 A | 11/2011 |

OTHER PUBLICATIONS

Awaya et al., "Self-Aligned Passivation Technology for Copper Interconnection Using Copper-Aluminum Alloy," *Japanese Journal of Applied Physics*, vol. 36: Part 1, No. 3B pp. 1548-1553, Mar. 1997.

(Continued)

*Primary Examiner* — Bac Au
(74) *Attorney, Agent, or Firm* — Knobbe Martens Olson & Bear LLP

(57) ABSTRACT

A display apparatus includes a base substrate, a data line, and a pixel. The data line is disposed on the base substrate to transmit a data signal and has a multi-layer structure including at least three conductive layers stacked one on another. The data line includes a lower conductive layer, an intermediate conductive layer, and an upper conductive layer. The lower conductive layer is disposed on the base substrate, the intermediate conductive layer is disposed on the lower conductive layer and includes copper and aluminum, and the upper conductive layer is disposed on the intermediate conductive layer and includes copper. The pixel is driven in response to the data signal from the data line.

20 Claims, 9 Drawing Sheets

(56) References Cited

U.S. PATENT DOCUMENTS

| | | | |
|---|---|---|---|
| 7,977,128 B2 | 7/2011 | Cho et al. | |
| 8,373,832 B2 | 2/2013 | Takawawa et al. | |
| 2007/0295967 A1 | 12/2007 | Harada et al. | |
| 2011/0186843 A1 | 8/2011 | Kim et al. | |
| 2012/0194757 A1 | 8/2012 | Takasawa et al. | |
| 2012/0206685 A1 | 8/2012 | Takasawa et al. | |
| 2013/0009154 A1* | 1/2013 | Choi et al. | 257/59 |
| 2013/0032793 A1* | 2/2013 | Kim et al. | 257/43 |

OTHER PUBLICATIONS

Choi et al., "Origin of intrinsic stress in Y2O3 films deposited by reactive sputtering," *Journal of Vacuum Science and Technology A*, vol. 13: No. 6 pp. 2832-2835, 1995.

Ding et al.., "Effects of the addition of small amounts of Al to copper: Corrosion, resistivity, adhesion, morphology, and diffusion," *Journal of Applied Physics*, vol. 75 pp. 3627-3631, Apr. 1994.

Huang et al., "Transparent Conductive Al-Doped ZnO/Cu Bilayer Films Grown on Polymer Substrates at Room Temperature," *Chinese Physical Lett.*, vol. 28: No. 12 pp. 127306-1 to 127306-4, 2011.

Lim et al., "The influence of grain size on the indention hardness of high-purity copper and aluminium," *Philosophical Magazine A*, vol. 82: No. 10, pp. 2071-2080, 2002.

Park et al., "Step Coverage Evaluation of Copper Films Prepared by Magnetron Sputtering," *VMIC Conference*, pp. 295-297, Jun. 11-12, 1991.

Seo et al., "P-61: A Study on the Galvanic Reaction between Cu and Mo as Well As MoW for TFT-LCDs by Using a Zero-Resistance Ammeter," *SID 09 Digest*, pp. 1320-1323, 2009.

Simões et al., "In Situ TEM study of grain growth in nanocrystalline copper thin films," *Nanotechnology*, vol. 21: pp. 1-12, Mar. 10, 2010.

Singh et al., "Fracture toughness and fatigue crack growth characteristics of nanotwinned copper," *Acta Materialia*, vol. 59: pp. 2437-2446, 2011.

Takeyama et al., "Oxidation Characteristics of Thin Al-Mo Alloy Films with Various Compositions as Metal Capping Layer on Cu," *Japanese Journal of Applied Physics*, vol. 51: pp. 05EA06-1 to 05EA06-5, May 21, 2012.

Wang et al., "Morphology and microstructure control of sputter-deposited copper films by addition of Cr," *Symposia D, E and F from MRS International Materials Research Conference—Journal of Physics: Conference Series*, 152: pp. 1-7, 2009.

Yang et al., "Strengthening TiN diffusion barriers for Cu metallization by lightly doping Al," *Applied Physics Letters*, 87: pp. 121911-1 to 121911-3, 2005.

Yen et al., "Investigation of thermal stability of Mo thin-films as the buffer layer and various Cu metallization as interconnection materials for thin film transistor-liquid crystal display applications," *Thin Solid Films*, vol. 515: pp. 7209-7216, 2007.

* cited by examiner

[Ti(20nm) / Cu(500nm)]

Crystal Average Diameter ≒ 463.6nm

[Ti(20nm) / CuMgAl(20nm) / Cu(500nm)]

Crystal Average Diameter ≒ 268.7nm

DISPLAY APPARATUS AND METHOD OF MANUFACTURING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This U.S. non-provisional patent application claims priority under 35 U.S.C. §119 of Korean Patent Application No. 10-2013-0055843, filed on May 16, 2013, the contents of which are hereby incorporated by reference in its entirety.

BACKGROUND

1. Field

The present disclosure relates to a display apparatus capable of driving pixels using data lines with low resistance and a method of manufacturing the display apparatus.

2. Description of the Related Technology

In general, a display apparatus, such as a liquid crystal display apparatus, an organic electroluminescent display apparatus, or the like, includes a substrate, driving signal lines disposed on the substrate to transfer driving signals, and pixels electrically connected to the driving signal lines. The driving signal lines are formed of a metal material and transfer the driving signals from an external source to the pixels.

As a display area of the display apparatus increases, a length of the driving signal lines increases. Accordingly, an electrical resistance of the driving signal lines increases. In this case, the driving signals may be difficult to be transferred through the driving signal lines. In recent years, copper, generally with a relatively low price and a low specific resistance has been widely used to form the driving signal lines.

SUMMARY OF CERTAIN INVENTIVE ASPECTS

The present disclosure provides a display apparatus capable of driving pixels using data lines with low resistance and a method of manufacturing the display apparatus to improve a manufacturing yield of the display apparatus.

Embodiments of the inventive concept provide a display apparatus including a base substrate, a data line, and a pixel. The data line is disposed on the base substrate to transmit a data signal and has a multi-layer structure including at least three conductive layers stacked one on another. The pixel is driven in response to the data signal from the data line.

The data line includes a lower conductive layer, an intermediate conductive layer, and an upper conductive layer. The lower conductive layer is disposed on the base substrate, the intermediate conductive layer is disposed on the lower conductive layer and includes copper and aluminum, and the upper conductive layer is disposed on the intermediate conductive layer and includes copper.

Embodiments of the inventive concept provide a method of manufacturing a display apparatus as follows. A data line is formed on a base substrate and a pixel is formed to be electrically connected to the data line.

The data line is formed by forming a lower conductive layer on the base substrate, forming an intermediate conductive layer, which contains a copper and an aluminum, on the lower conductive layer, and forming an upper conductive layer, which contains the copper, on the intermediate conductive layer.

According to the above, the average diameter of the crystals in the upper conductive layer containing copper is reduced by the intermediate conductive layer included in the data line. In addition, the crystals in the upper conductive layer are grown in various directions by the intermediate conductive layer. Thus, although a foreign substance exists when the data line is formed, the defect may be prevented from coming to the data line since the upper conductive layer covers the step difference caused by the foreign substance.

As a result, the data line having the low resistance, the gate line having the same structure as the data line, the electrodes of the thin film transistor may be easily manufactured, and thus a manufacturing yield of the display apparatus including the gate line, the data line, and the thin film transistor may be improved.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION OF CERTAIN INVENTIVE EMBODIMENTS

Figure 1:
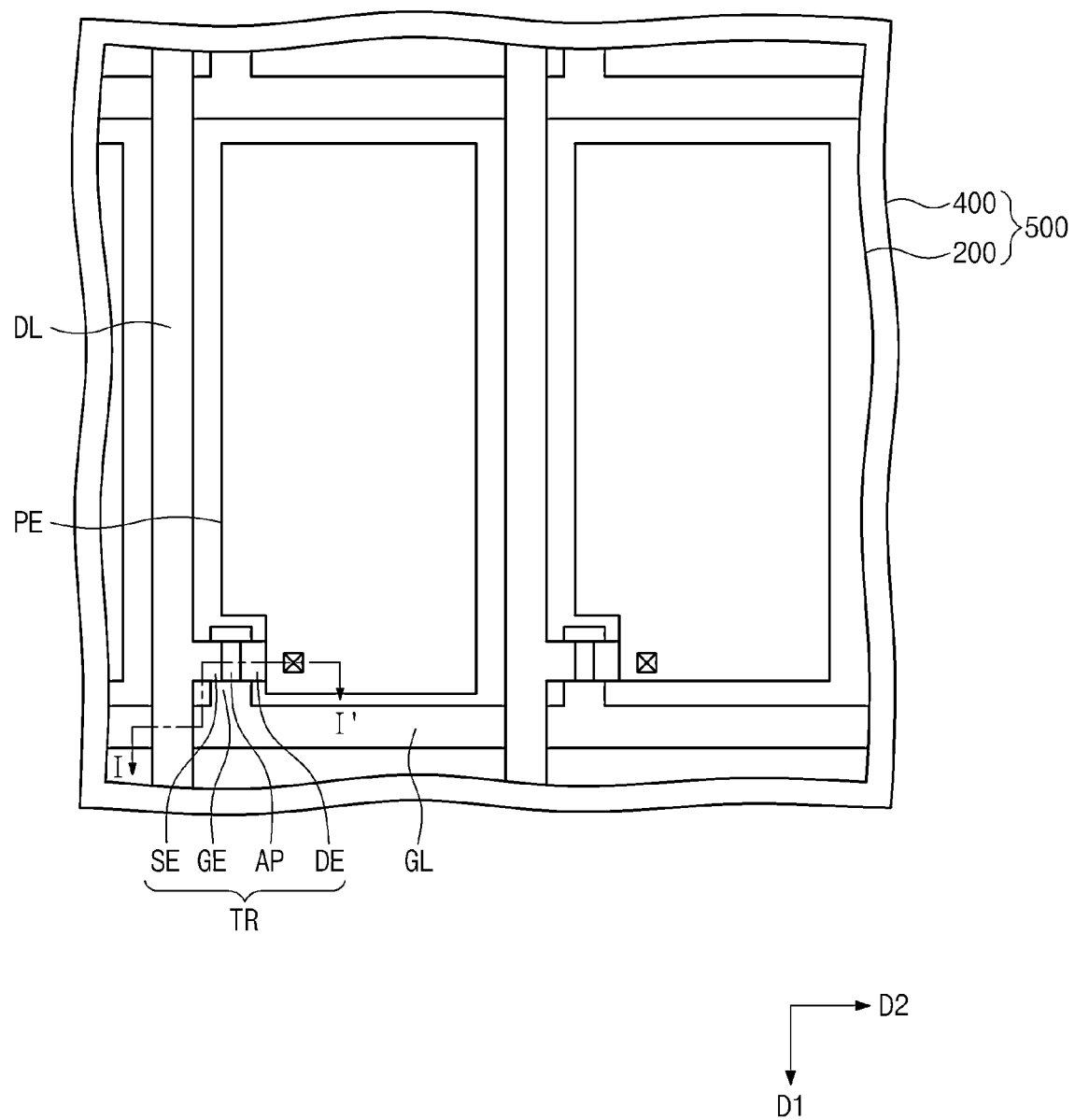
FIG. 1 is a plan view showing a display apparatus according to an embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers generally refer to like elements throughout. As used herein, the term "and/or" includes any and all combinations of one or more of the associated listed items.

It will be understood that, although the terms first, second, and the like may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

Figure 2:
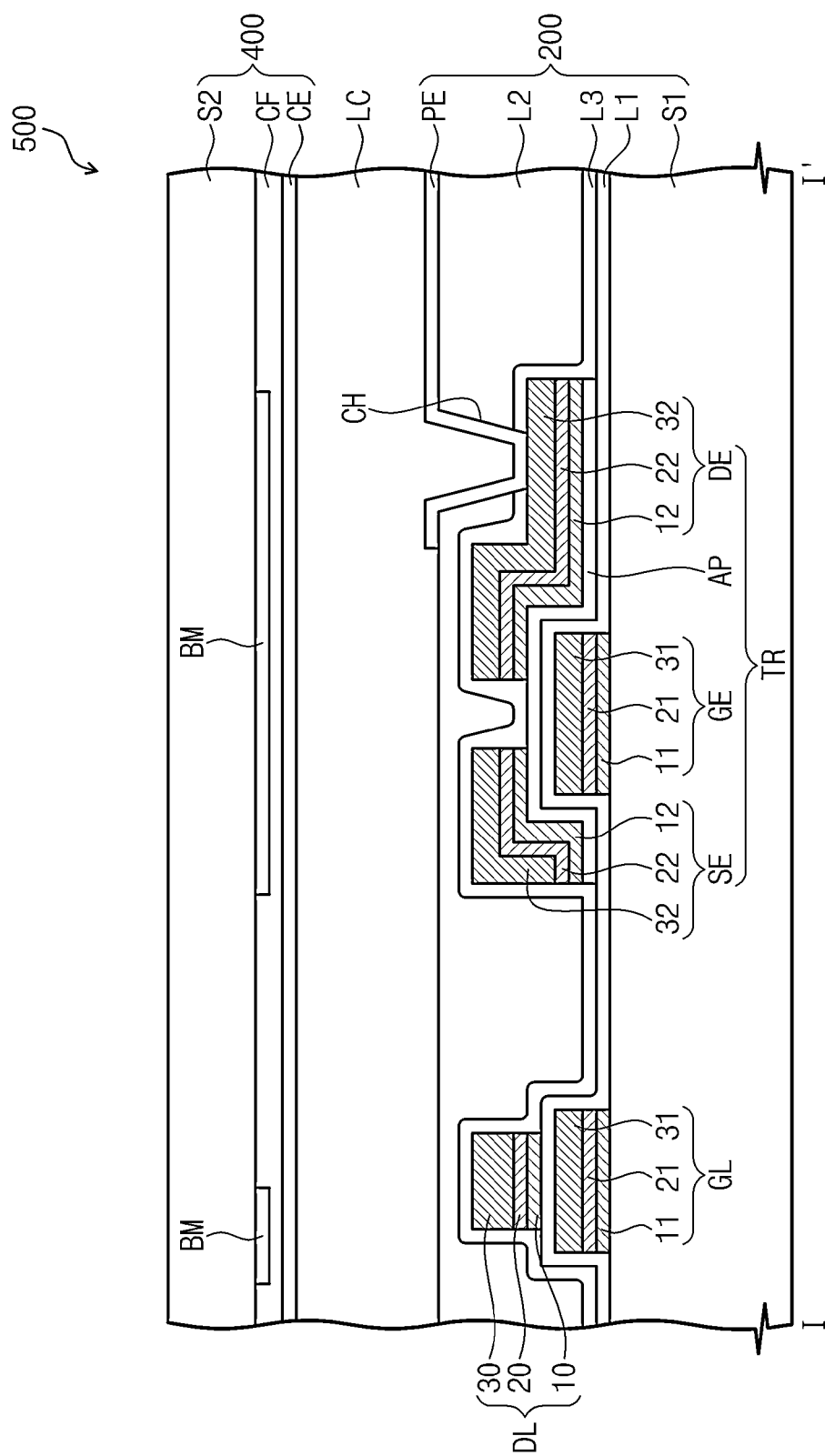
FIG. 2 is a cross-sectional view taken along a line I-I' shown in FIG. 1.

FIG. 1 is a plan view showing a display apparatus according to an embodiment of the present disclosure and FIG. 2 is a cross-sectional view taken along a line I-I' shown in FIG. 1.

Referring to FIGS. 1 and 2, a display apparatus 500 may be, but not limited to, a liquid crystal display apparatus. In such embodiments, the display apparatus 500 includes a first substrate 200, a second substrate 400, and a liquid crystal layer LC. The first and second substrates 200 and 400 face each other and the liquid crystal layer LC is interposed between the first and second substrates 200 and 400. In addition, although not shown in FIGS. 1 and 2, the display apparatus 500 may further include a backlight assembly (not shown) to emit a light to the display apparatus 500, and the display apparatus 500 displays an image using the light.

The first substrate 200 includes a base substrate 51, a plurality of pixels, a plurality of gate lines, a plurality of data lines, and a plurality of thin film transistors. The pixels include pixel electrodes, respectively. Hereinafter, one pixel electrode PE, one gate line GL, one data line DL, and one thin film transistor TR is described in detail.

The base substrate 51 may be a transparent insulating substrate, such as, for example, a glass substrate or a plastic substrate. When the base substrate 51 is a plastic substrate, the base substrate S1 may have flexibility.

The gate line GL is disposed on the base substrate S1 and transfers a gate signal to turn on the thin film transistor TR. In one embodiment, the gate line GL is extended in a first direction D1 when viewed in a plan view, but it should not be limited to the first direction D1.

A first insulating layer L1 includes silicon oxide or silicon nitride and is disposed on the base substrate S1 to cover the gate line GL, and the data line DL is disposed on the first insulating layer L1 and insulated from the gate line GL. The data line DL transfers a data signal. In one embodiment, the data line DL is extended in a second direction D2 when viewed in a plan view, and crosses the gate line GL.

The thin film transistor TR is electrically connected to the gate line GL, the data line DL, and the pixel electrode PE. The thin film transistor TR includes a gate electrode GE, an active pattern AP, a source electrode SE, and a drain electrode DE.

The gate electrode GE is branched from the gate line GL, and the active pattern AP is disposed on the gate electrode GE while interposing the first insulating layer L1 therebetween. In one embodiment, the active pattern AP may include a semiconductor material, such as, for example, an amorphous silicon, a crystalline silicon, and the like, but it should not be limited thereto or thereby. For instance, the active pattern AP may include an oxide semiconductor material, such as IGZO, ZnO, $SnO_2$, $In_2O_3$, $Zn_2SnO_4$, $Ge_2O_3$, $HfO_2$, or a compound semiconductor material, such as GaAs, Gap, InP, and the like.

The source electrode SE is branched from the data line DL and is disposed on the active pattern AP. The drain electrode DE is disposed on the active pattern AP and is spaced apart from the source electrode SE. The drain electrode DE is electrically connected to the pixel electrode PE through a contact hole CH formed through a second insulating layer L2 and a third insulating layer L3.

According to the structure of the thin film transistor TR, the gate signal is applied to the gate electrode GE through the gate line GL, and the thin film transistor TR is turned on. Thus, the data signal applied to the data line DL is applied to the pixel electrode PE through the source electrode SE, the active pattern AP, and the drain electrode DE.

The third insulating layer L3 includes silicon oxide or silicon nitride and is disposed on the first insulating layer L1 to cover the thin film transistor TR. The second insulating layer L2 is disposed on the third insulating layer L3. The pixel electrode PE is disposed on the second insulating layer L2 and electrically connected to the drain electrode DE through the contact hole CH.

The second substrate 400 includes an opposite substrate S2, a color filter CF, a black matrix BM, and a common electrode CE. The opposite substrate S2 may be a transparent insulating substrate, and the black matrix BM is disposed on the opposite substrate S2 to correspond to the gate line GL, the data line DL, and the thin film transistor TR. In addition, the color filter CF is disposed on the opposite substrate S2 to cover the black matrix BM, and the common electrode CE is disposed on the color filter CF to generate an electric filed in cooperation with the pixel electrode PE, thereby controlling directors of liquid crystal molecules of the liquid crystal layer LC.

According to another embodiment, the common electrode CE may be disposed on the base substrate S1 to be spaced apart from the pixel electrode PE, and the color filter CF may be disposed on the base substrate S1 to correspond to the pixel electrode PE.

The data line DL has a multi-layer structure of plural layers. The data line DL includes a lower conductive layer 10, an intermediate conductive layer 20, and an upper conductive layer 30. The lower conductive layer 10 is disposed on the first insulating layer L1, the intermediate conductive layer 20 is disposed on the lower conductive layer 10, and the upper conductive layer 30 is disposed on the intermediate conductive layer 20.

The upper conductive layer 30 includes copper. The upper conductive layer 30 has the largest thickness among the lower conductive layer 10, the intermediate conductive layer 20, and the upper conductive layer 30. For example, the upper conductive layer 30 has a thickness of about 200 nm to about 1200 nm, and each of the lower conductive layer 10 and the intermediate conductive layer 20 has a thickness of about 10 nm to about 50 nm. Therefore, a part of the upper conductive layer 30 in the data line DL is greater than that of the lower conductive layer 10 or the intermediate conductive layer 20, and the upper conductive layer 30 includes copper with low specific resistance, so that an electrical resistance of the data line DL may be lowered.

The intermediate conductive layer 20 includes copper and aluminum. The intermediate conductive layer 20 is interposed between the upper conductive layer 30 and the lower conductive layer 10 to generate first and second effects. The first effect is that an average diameter of crystals of the upper conductive layer 30 is reduced, and the second effect is that a direction to which the crystals of the upper conductive layer 30 grow is diversified. The number of the crystals grown in the (111) direction increases in the upper conductive layer 30. This phenomenonis described in detail with reference to FIGS. 3A and 3B.

In one embodiment, a weight ratio of copper to aluminum in the intermediate conductive layer 20 is in a range from about 95:5 to 85:15. When the weight ratio of aluminum in the intermediate conductive layer 20 is less than about 5%, the first and second effects are difficult to occur, and when the weight ratio of aluminum exceeds about 15%, the electrical resistance of the data line DL increases.

In addition, the intermediate conductive layer 20 may further include a metal material, such as magnesium, nickel, cobalt, or the like, to prevent the intermediate conductive layer 20 from oxidizing.

As described above, the thickness of the intermediate conductive layer 20 is in a range from about 10 nm to about 50 nm. Since it is difficult to form the intermediate conductive layer 20 with the thickness less than about 10 nm, a minimum of the thickness of the intermediate conductive layer 20 may be about 10 nm. In addition, when the thickness of the intermediate conductive layer 20 exceeds about 50 nm, the first and second effects occur, but a surface resistance of the data line DL may be increased.

When the thickness of the intermediate conductive layer 20 is in the range from about 10 nm to about 50 nm, the surface resistance of the data line DL is in a range from about 45 mΩ/cm$^2$ to about 55 mΩ/cm$^2$. However, as the thickness of the intermediate conductive layer 20 increases over about 50 nm, the surface resistance of the data line DL increases to approach to about 70 mΩ/cm$^2$ that is a surface resistance of the data line formed of aluminum with a specific resistance about 1.6 times greater than that of copper. Thus, when the thickness of the intermediate conductive layer 20 exceeds about 50 nm, the surface resistance of the data line DL formed of copper is not greatly reduced as compared to that of the data line formed of aluminum even though the data line DL is formed of copper.

The lower conductive layer 10 has an adhesive force greater than that of the intermediate conductive layer 20 and the upper conductive layer 31 with respect to a material containing silicon, and thus the lower conductive layer 10 includes at least one of titanium, tantalum, or molybdenum. Accordingly, when the first insulating layer L1 includes silicon oxide or silicon nitride and the data line DL is formed on the first insulating layer L1, a void may be prevented from occurring between the data line DL and the first insulating layer L1 by the adhesive force between the lower conductive layer 10 and the first insulating layer L1.

Figure 3A:
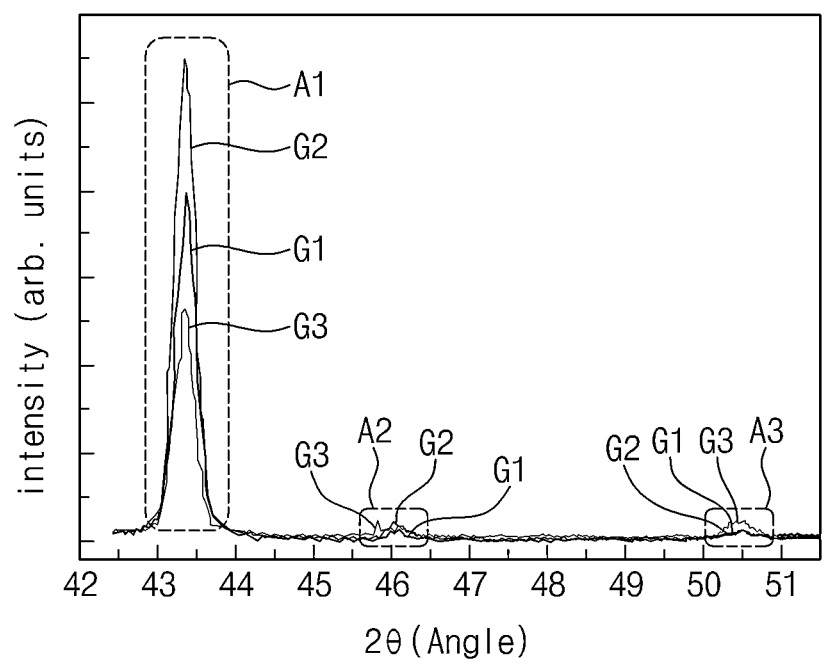
FIGS. 3A and 3B are graphs showing effects of the display apparatus according to an embodiment of the present disclosure.
Figure 3B:
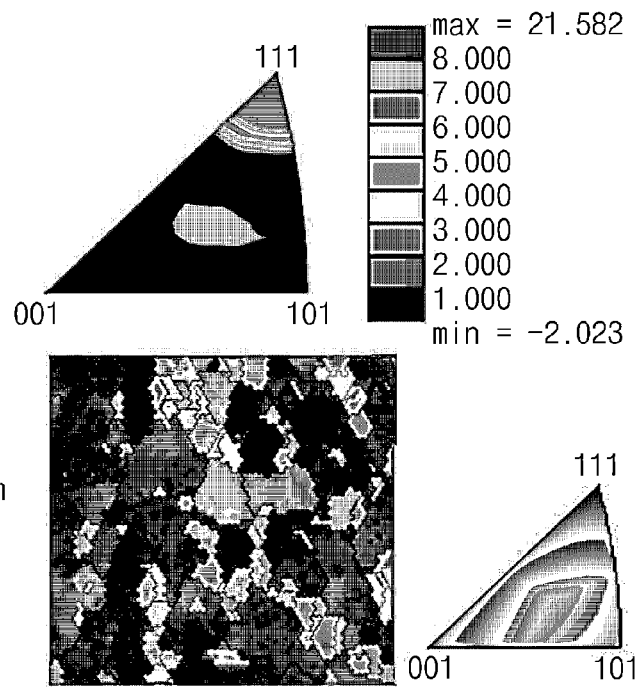
Figure 3B:
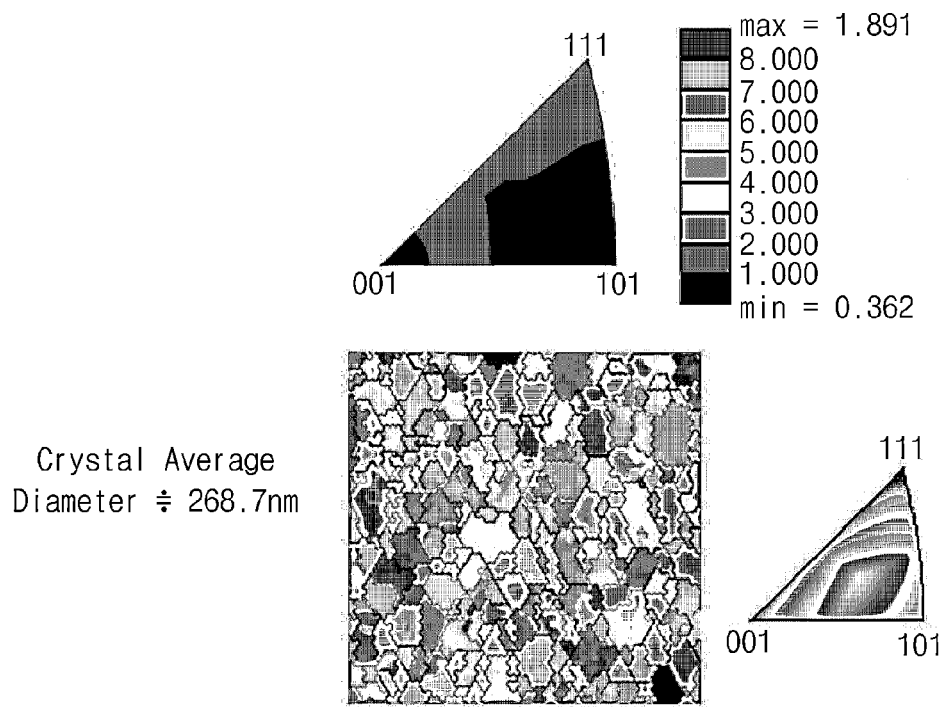

FIGS. 3A and 3B are graphs showing effects of the display apparatus according to an embodiment of the present disclosure. FIG. 3A is a graph showing the first effect and FIG. 3B is a diagram showing the second effect described above.

Referring to FIG. 3A, a first graph G1 shows a direction in which crystals of a conductive layer containing copper grow, which corresponds to a first sample shown in Table 1, a second graph G2 shows a direction in which crystals of an upper conductive layer containing copper grow, which corresponds to a second sample shown in Table 1, and a third graph G3 shows a direction in which crystals of an upper conductive layer containing copper grow, which corresponds to a third sample shown in Table 1.

TABLE 1

| Sample number | Structure of data line | Materials for data line | |
|---|---|---|---|
| 1 | Single-layer | Cu (500 nm) | First Comparative Example |
| 2 | Double-layer | Ti (20 nm)(lower conductive layer)/Cu (500 nm) (upper conductive layer) | Second Comparative Example |
| 3 | Triple-layer | Ti (20 nm) (lower conductive layer)/CuMgAl (20 nm) (intermediate conductive layer)/Cu (500 nm) (upper conductive layer) | Example Embodiment |

The data line according to the first sample, or the first comparative example, has a single-layer structure of copper, and the data line according to the second sample, or the second comparative example, has a double-layer structure of the lower conductive layer containing titanium and the upper conductive layer containing copper and disposed on the lower conductive layer. The data line according to the third sample, or the example embodiment, has a triple-layer structure of the lower conductive layer containing titanium, the intermediate conductive layer containing aluminum, magnesium, and copper and disposed on the lower conductive layer, and the upper conductive layer containing copper and disposed on the intermediate conductive layer. The structure of the data line corresponding to the third sample is the same as that of the data line DL (refer to FIG. 2) described with reference to FIGS. 1 and 2.

In the first to third graphs G1 to G3, a horizontal axis indicates an angle corresponding to 2-theta value, which corresponds to a sum of an angle of an x-ray incident into a sample and an angle of the x-ray reflected by the sample, according an x-ray diffraction analysis, and a vertical axis indicates a relative strength of detected peaks. In the x-ray diffraction analysis, as the strength of the peak becomes strong when the 2-theta is in a first section A1 from about 43 degrees to about 44 degrees, the number of the crystals grown in (111) direction becomes large. In addition, as the strength of the peak becomes strong when the 2-theta is in a second section A2 from about 45.5 degrees to about 46.5 degrees, the number of the crystals grown in (200) direction becomes large. Further, as the strength of the peak becomes strong when the 2-theta is in a third section A3 from about 50 degrees to about 51 degrees, the number of the crystals grown in (220) direction becomes large.

When intensities of the peaks of the first to third graphs G1 to G3 are compared with each other in the first section A1, the peak of the second graph G2 is strongest, the peak of the third graph G3 is weakest, and the peak of the first graph G1 is weaker than that of the second graph G2 and stronger than that of the third graph G3. In the second section A2, the peaks of the second and third graphs G2 and G3 are stronger than that of the first graph G1. In the third section A3, the peak of the third graph G3 is strongest, and the peaks of the first and second graphs G1 and G2 are weaker than that of the third graph G3.

According to the intensities of the peaks of the first to third graphs G1 to G3, the intensity of the peak of the third graph G3 is weaker than the intensity of the peaks of the first and second graphs G1 and G2 in the first section A1. In the third section A3, the intensity of the peak of the third graph G3 is stronger than the intensity of the peaks of the first and second graphs G1 and G2. This means that the growth direction of the portion of the copper crystals of the upper conductive layer is changed from (111) direction to (200) direction and (220) direction by the intermediate conductive layer when the data line DL includes the lower conductive layer 10, the intermediate conductive layer 20, and the upper conductive layer 30, and the intermediate conductive layer includes copper, magnesium, and aluminum.

Referring to FIG. 3B, diameters and growth directions of the crystals of the first and second samples are described in conjunction with the following Table 2 using an electron backscatter diffraction (EBSD) analysis.

TABLE 2

| Sample number | Structure of data line | Materials for data line | |
|---|---|---|---|
| 1 | Double-layer | Ti (20 nm)(lower conductive layer)/Cu (500 nm) (upper conductive layer) | Comparative Example |
| 2 | Triple-layer | Ti (20 nm) (lower conductive layer)/CuMgAl (20 nm) (intermediate conductive layer)/Cu (500 nm) (upper conductive layer) | Example Embodiment |

As shown in Table 2, the data line according to the first sample, or the comparative example, has a double-layer structure of the lower conductive layer containing titanium and the upper conductive layer containing copper and disposed on the lower conductive layer. The data line according to the second sample, or the example embodiment, has a triple-layer structure of the lower conductive layer containing titanium, the intermediate conductive layer containing aluminum, magnesium, and copper and disposed on the lower conductive layer, and the upper conductive layer containing copper and disposed on the intermediate conductive layer. The structure of the data line corresponding to the second sample is the same as that of the data line DL (refer to FIG. 2) described with reference to FIGS. 1 and 2.

According to the analysis result of the first sample in FIG. 3B, most of the crystals in the first sample are grown in the (111) direction and the crystals in the first sample have an average diameter of about 463.6 nm. On the other hand, according to the analysis result of the second sample in FIG. 3B, the growth direction of the crystals in the second sample is changed from the (111) direction to (001) direction and (101) direction and the crystals in the second sample have the average diameter of about 268.7 nm.

As described above, when the data line includes the intermediate conductive layer containing magnesium and aluminum, the number of the copper crystals grown in the (001) and (101) directions in addition to the (111) direction increases in the upper conductive layer disposed on the intermediate conductive layer. In addition, the average diameter of the copper crystals in the upper conductive layer decreases. Accordingly, when the data line has the above-mentioned structure according to one embodiment, a covering characteristic of the upper conductive layer may be improved to planarize a step difference of an area in which the upper conductive layer is formed even though the area in which the upper conductive layer is formed is not flat. In particular, although a step difference occurs in the area due to a foreign substance, the upper conductive layer may be prevented from being cracked due to the foreign substance since the area is coated with the upper conductive layer to planarize the step difference.

Referring to FIG. 2 again, when the data line DL has the multi-layer structure of the lower conductive layer 10, the intermediate conductive layer 20, and the upper conductive layer 30, which are sequentially stacked one on another, each of the gate electrode GE, the source electrode SE, the drain electrode DE, and the gate line GL may have the multi-layer structure.

The gate line GL and the gate electrode GE are formed through the same patterning process, and thus each of the gate line GL and the gate electrode GE includes a first lower conductive layer 11, a first intermediate conductive layer 21, and a first upper conductive layer 31, which are sequentially stacked. In one embodiment, the first lower conductive layer 11 includes the same material as the lower conductive layer 10, the first intermediate conductive layer 21 includes the same material as the intermediate conductive layer 20, and the first upper conductive layer 31 includes the same material as the upper conductive layer 30.

In addition, each of the source electrode SE and the drain electrode DE are formed through the same patterning process, so that each of the source electrode SE and the drain electrode DE includes a second lower conductive layer 12, a second intermediate conductive layer 22, and a second upper conductive layer 32. In this case, the second lower conductive layer 12 includes the same material as the lower conductive layer 10, the second intermediate conductive layer 22 includes the same material as the intermediate conductive layer 20, and the second upper conductive layer 32 includes the same material as the upper conductive layer 30. Thus, the first and second effects may occur when the gate electrode GE, the source electrode SE, the drain electrode DE, and the gate line GL are formed.

Figure 4:
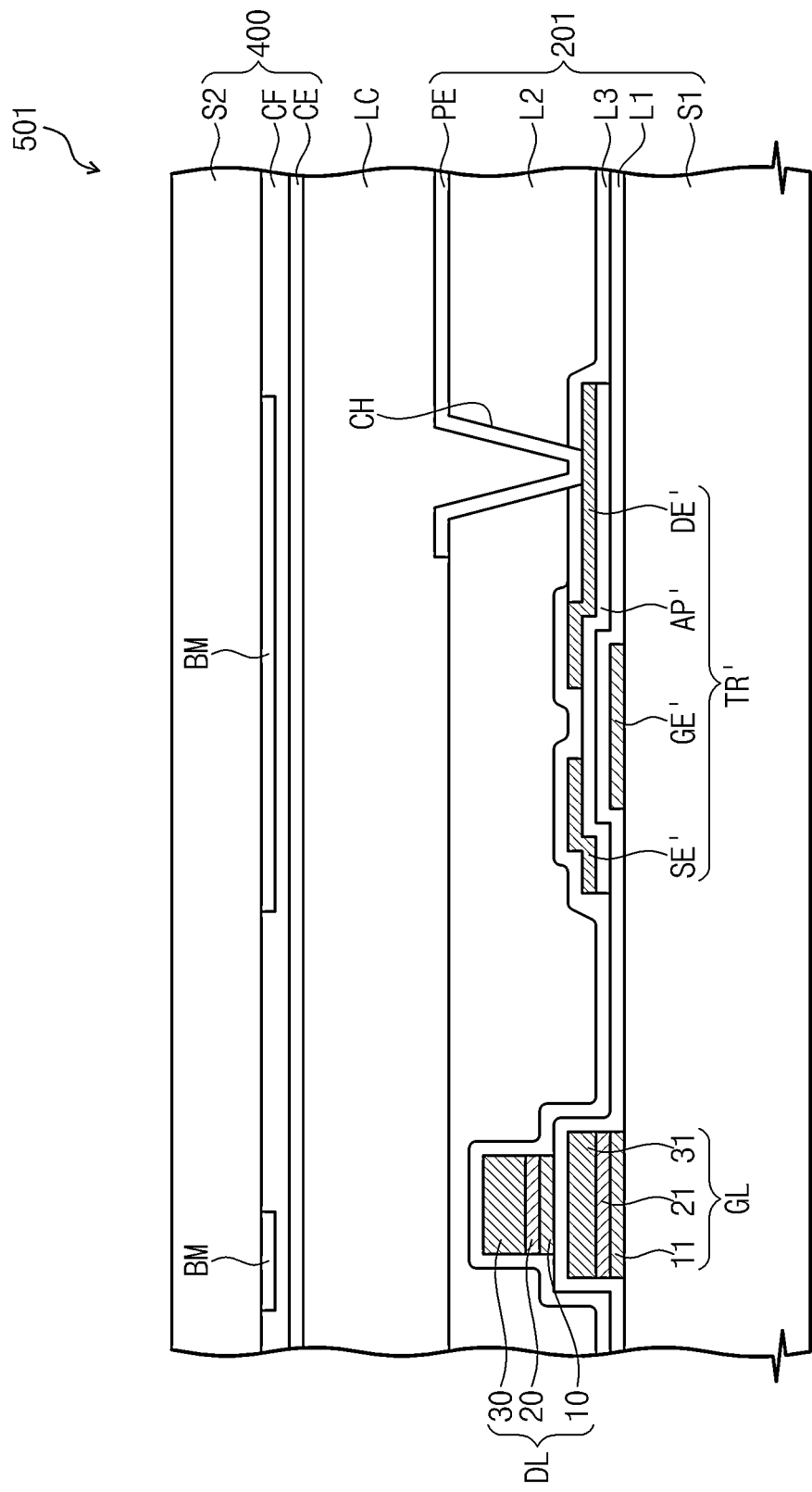
FIG. 4 is a cross-sectional view showing a display apparatus according to another exemplary embodiment of the present disclosure.

FIG. 4 is a cross-sectional view showing a display apparatus according to another embodiment of the present disclosure. In FIG. 4, the same reference numerals generally denote the same elements in FIGS. 1, 2, 3A, and 3B, and thus detailed descriptions of the same elements will be omitted.

Referring to FIG. 4, a display apparatus 501 is a liquid crystal display apparatus, and thus the display apparatus 501 includes a first substrate 201, a second substrate 400, and a liquid crystal layer LC. When the first substrate 201 shown in FIG. 1 is compared to the first substrate 200 (refer to FIG. 2), a thin film transistor TR' of the first substrate 201 includes a gate electrode GE', a source electrode SE', and a drain electrode DE', each of which has a single-layer structure.

Different from the data line DL and the gate line GL, each of which has the multi-layer structure and the low resistance, the gate electrode GE', the source electrode SE', and the drain electrode DE' do not necessarily have the resistance lower than that of the data line DL and the gate line GL. Accordingly, each of the gate electrode GE', the source electrode SE', and the drain electrode DE' may have the single-layer structure, and thus each of the gate electrode GE', the source electrode SE', and the drain electrode DE' may have a thickness thinner than that shown in FIG. 2.

Therefore, a thickness of first and third insulating layers L1 and L3 may be reduced in accordance with the reduction in thickness of the electrodes of the thin film transistor TR'. As a result, since the electrodes of the thin film transistor TR' are sufficiently covered by the first and third insulating layers L1 and L3 even though the thickness of the first and third insulating layers L1 and L3 is reduced, a time required to form the first and third insulating layers L1 and L3.

Figure 5:
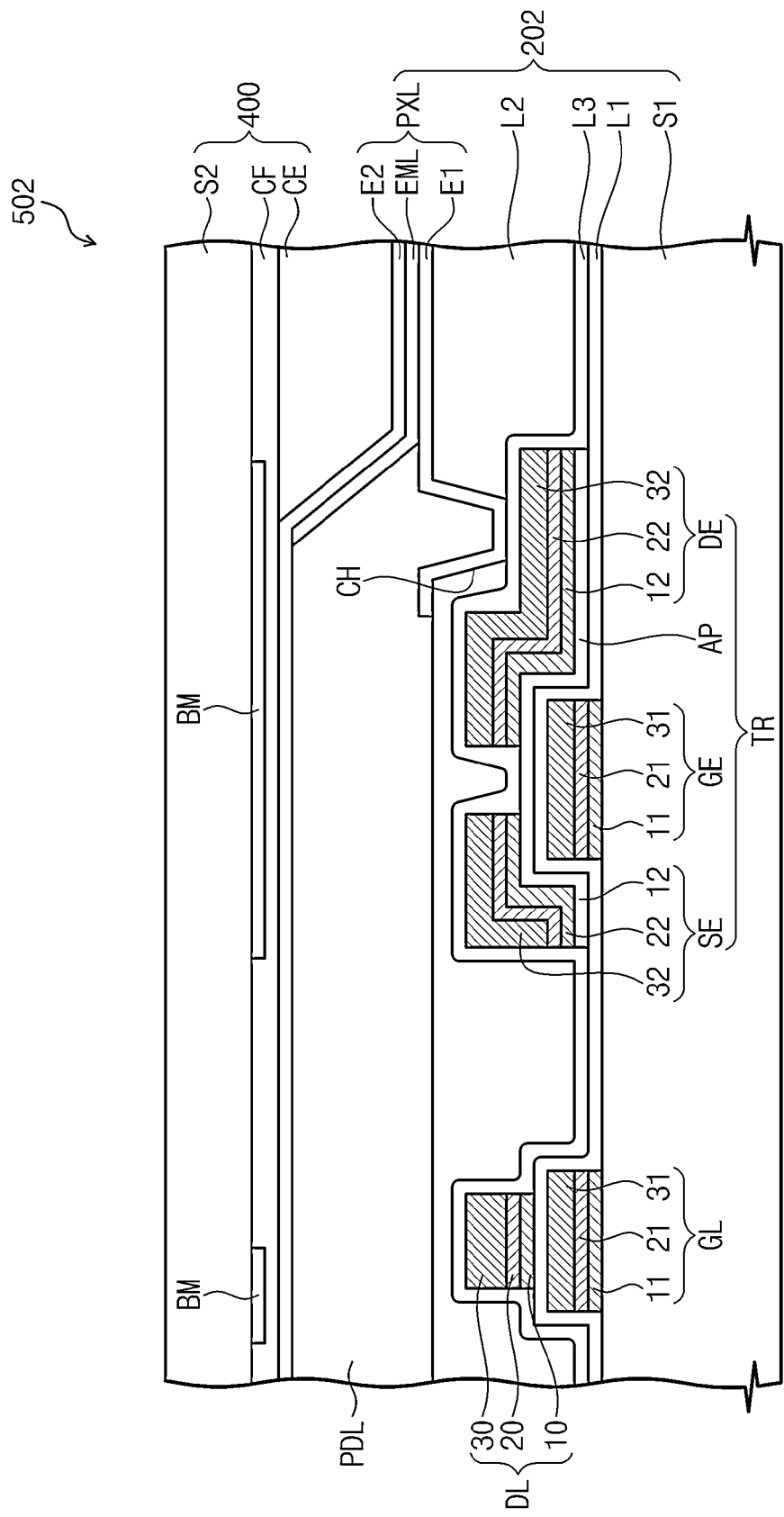
FIG. 5 is a cross-sectional view showing a display apparatus according to another embodiment of the present disclosure.

FIG. 5 is a cross-sectional view showing a display apparatus according to another embodiment of the present disclosure. In FIG. 5, the same reference numerals generally denote the same elements in FIG. 4, and thus detailed descriptions of the same elements will be omitted.

Referring to FIG. 5, a display apparatus 502 is an organic electroluminescent display apparatus and includes a first substrate 202 and a second substrate 400.

The first substrate 202 includes a pixel PXL, and the pixel PXL includes a first electrode E1 electrically connected to a thin film transistor TR, an organic light emitting layer EML disposed on the first electrode E1, and a second electrode E2 disposed on the organic light emitting layer EML.

In one embodiment, the first substrate 202 may further include a pixel definition layer PDL disposed on a second insulating layer L2. The pixel definition layer PDL is provided with an opening formed therethrough, and thus the organic light emitting layer EML makes contact with the first electrode E1 through the opening.

In one embodiment, the organic light emitting layer EML may have a single-layer structure and the organic light emitting layer EML emits a white light. According to another embodiment, the organic light emitting layer EML may include a plurality of sub-organic light emitting layers (not shown) spaced apart from each other to emit color lights.

Figure 6A:
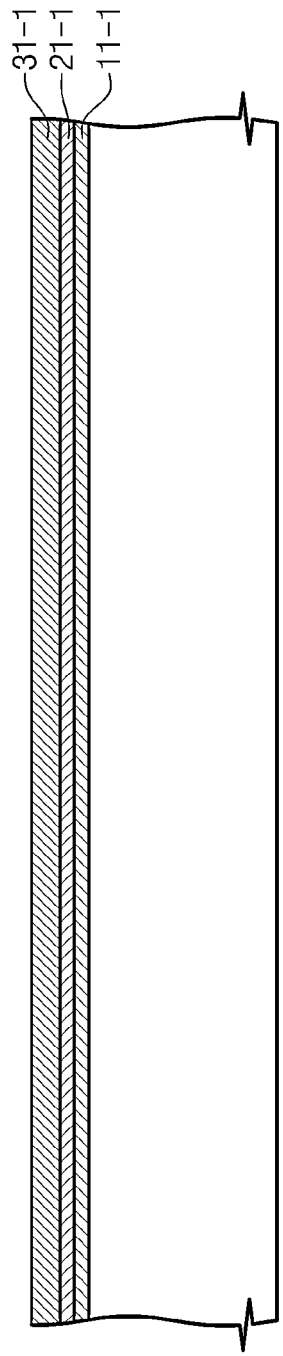
FIGS. 6A and 6D are cross-sectional views showing a manufacturing method of the display apparatus shown in FIG. 2.
Figure 6B:
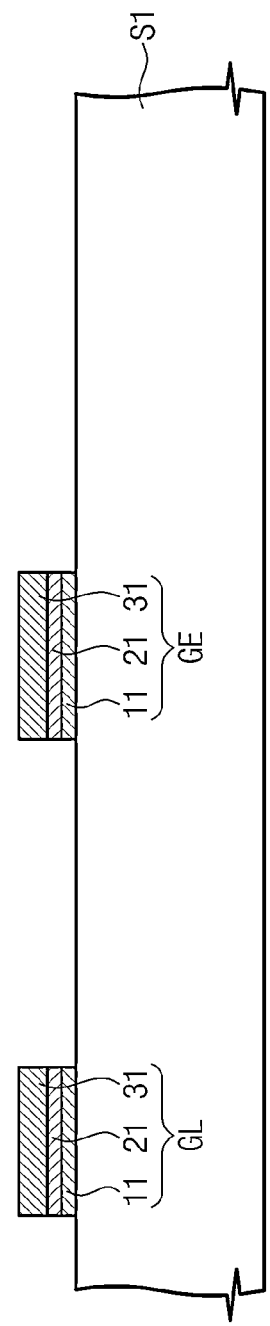
Figure 6C:
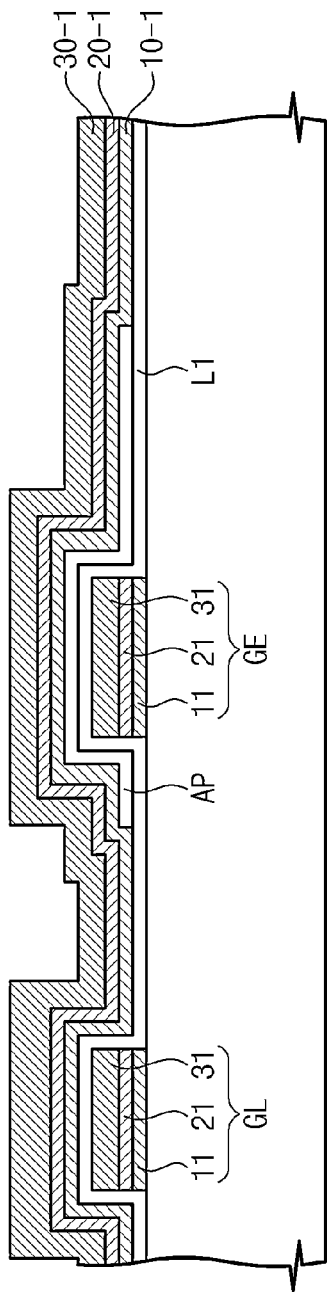
Figure 6D:
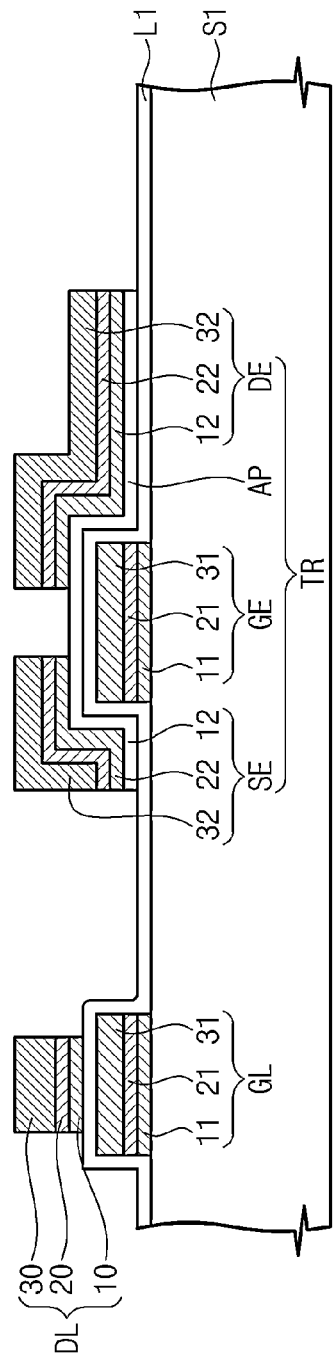

FIGS. 6A and 6D are cross-sectional views showing a manufacturing method of the display apparatus shown in FIG. 2.

Referring to FIGS. 6A and 6B, a first preliminary conductive layer 11-1, a second preliminary conductive layer 21-1, and a third preliminary conductive layer 31-1 are formed on the base substrate S1. In one embodiment, the first, second, and third preliminary conductive layers 11-1, 21-1, and 31-1 may be successively formed using a sputtering method. The first preliminary conductive layer 11-1 includes at least one of titanium, tantalum, or nickel, the second preliminary conductive layer 21-1 includes copper, aluminum, and magnesium, and the third preliminary conductive layer 31-1 includes copper.

Then, the first to third preliminary conductive layers 11-1 to 31-1 are patterned using an etchant to form the first lower conductive layer 11, the first intermediate conductive layer 21, and the first upper conductive layer 31, thereby forming the gate line GL and the gate electrode GE.

A foreign substance may be entered into between two adjacent layers among the first to third preliminary conductive layers 11-1 to 31-1 while the first to third preliminary conductive layers 11-1 to 31-1 are formed. For instance, the foreign substance may exist on the second preliminary conductive layer 21-1 after the first and second preliminary conductive layers 11-1 and 21-1 are formed. In this case, the third preliminary conductive layer 31-1 or the first upper conductive layer 31 is required to cover the step difference caused by the foreign substance.

In one embodiment, since the first intermediate conductive layer 21 is disposed under the first upper conductive layer 31 and includes copper, aluminum, and magnesium, the first and second effects may occur on the crystals in the first upper conductive layer 31. Thus, the foreign substance is completely covered by the third preliminary conductive layer 31-1 or the first upper conductive layer 31.

Referring to FIGS. 6C and 6D, the first insulating layer L1 is formed to cover the gate line GL and the gate electrode GE, and the active pattern AP is formed on the first insulating layer L1 to overlap with the gate electrode GE.

A fourth preliminary conductive layer 10-1, a fifth preliminary conductive layer 20-1, and a sixth preliminary conductive layer 30-1 are sequentially formed. In one embodiment, the fourth, fifth, and sixth preliminary conductive layers 10-1, 20-1, and 30-1 may be successively formed using a sputtering method. The fourth preliminary conductive layer 10-1 includes at least one of titanium, tantalum, or nickel, the fifth preliminary conductive layer 20-1 includes copper, aluminum, and magnesium, and the sixth preliminary conductive layer 30-1 includes copper.

Then, the fourth to sixth preliminary conductive layers 10-1 to 30-1 are patterned using an etchant to form the lower conductive layer 10, the intermediate conductive layer 20, and the upper conductive layer 30, thereby forming the data line DL, the source electrode SE, and the drain electrode DE.

A foreign substance may be entered into between two adjacent layers among the fourth to sixth preliminary conductive layers 10-1 to 30-1 while the fourth to sixth preliminary conductive layers 10-1 to 30-1 are formed. For instance, the foreign substance may exist on the fifth preliminary conductive layer 20-1 after the fourth and fifth preliminary conductive layers 10-1 and 20-1 are formed. In this case, the sixth preliminary conductive layer 30-1 or the upper conductive layer 30 are required to cover the step difference caused by the foreign substance.

In one embodiment, since the intermediate conductive layer 20 is disposed under the upper conductive layer 30, the first and second effects may occur on the crystals in the upper conductive layer 30. Thus, the foreign substance is completely covered by the sixth preliminary conductive layer 30-1 or the upper conductive layer 30 even though the foreign substance exists on the fifth preliminary conductive layer 20-1.

Figure 7A:
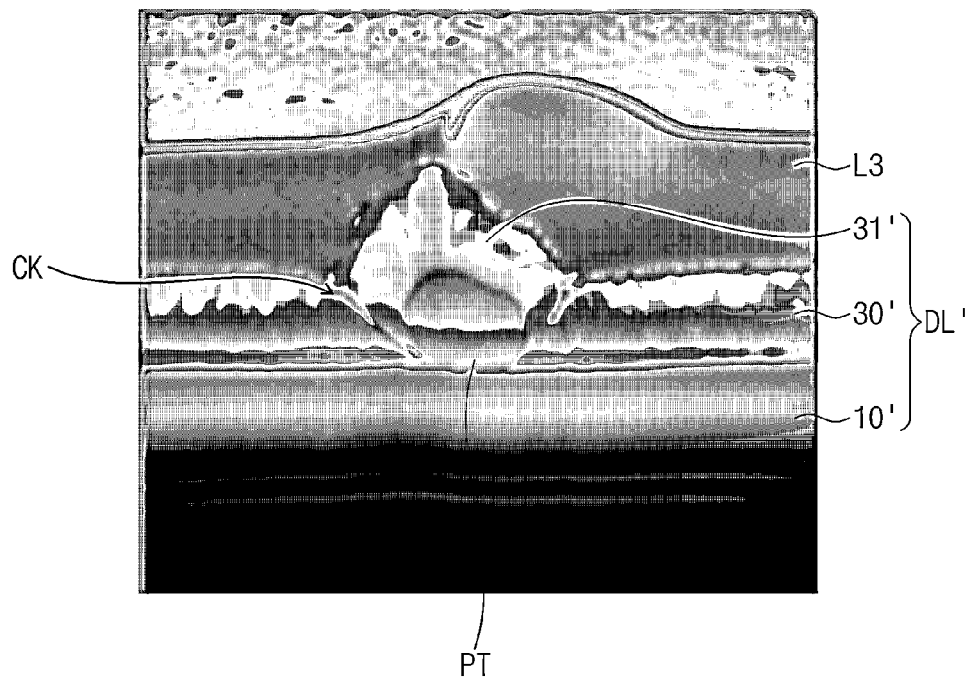
FIGS. 7A and 7B are photographs showing cross-sectional views of data lines formed while a foreign substance exists in a comparative example and an example embodiment.
Figure 7B:
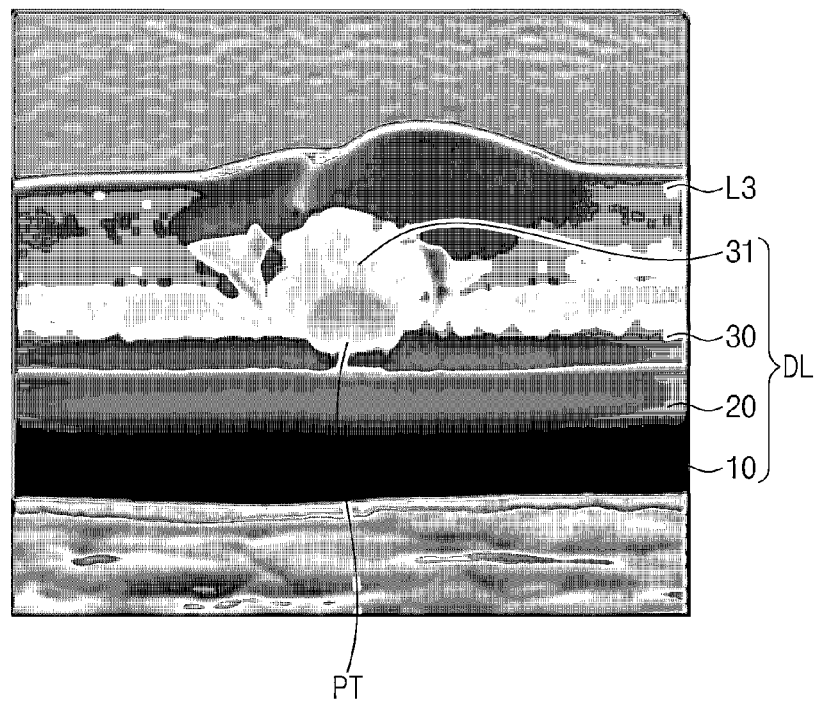

FIGS. 7A and 7B are photographs showing cross-sectional views of data lines formed while the foreign substance exists in the comparative example and the example embodiment. In more detail, FIG. 7A shows a cross-section of the data line having the structure corresponding to the first sample shown in Table 2, and FIG. 7B shows a cross-section of the data line having the structure corresponding to the second sample shown in Table 2.

Referring to FIG. 7A, the data line DL' includes the lower conductive layer 10' and the upper conductive layer 30' and the foreign substance PT exists between the lower conductive layer 10' and the upper conductive layer 30'. When a portion of the upper conductive layer 30', which covers the foreign substance PT, is referred to as a cover portion 31', a crack CK occurs between the cover portion 31' and the upper conductive layer 30'. In this case, an etchant used to pattern another conductive layer on the data line DL' infiltrates into the crack CK. Thus, the foreign substance PT and the cover portion 31' are separated from the data line DL' and the data line DL' and the conductive pattern may be shorted to each other.

Referring to FIG. 7B, the data line DL includes the lower conductive layer 10, the intermediate conductive layer 20, and the upper conductive layer 30, and the foreign substance PT exists between the intermediate conductive layer 20 and the upper conductive layer 30. In this case, the first and second effects occur on the crystals in the upper conductive layer 30 by the intermediate conductive layer 20 such that the crystals are grown in various directions and the average diameter of the crystals is reduced. Accordingly, the foreign substance PT may be easily coated with the upper conductive layer 30.

Therefore, a cover portion 31 of the upper conductive layer 30 may be prevented from being disconnected from the other portion of the upper conductive layer 30. As a result, although the foreign substance PT exists between the intermediate conductive layer 20 and the upper conductive layer 30, a defect may be prevented from coming to the data line DL.

Referring to FIG. 2 again, after the data line DL, the source electrode SE, and the drain electrode DE are formed, the third insulating layer L3 is formed and the second insulating layer L2 is formed on the third insulating layer L3. Then, the second and third insulating layers L2 and L3 are partially etched to form the contact hole CH through which the drain electrode DE is exposed. After that, the pixel electrode PE is formed on the second insulating layer L2 to make contact with the drain electrode DE through the contact hole CH, thereby manufacturing the first substrate 200.

Then, the second substrate 400 is manufactured and the first and second substrates 200 and 400 are coupled to each other such that the liquid crystal layer LC is interposed between the first substrate 200 and the second substrate 400, thereby manufacturing the display apparatus 500.

Although certain embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A display apparatus comprising:
   a base substrate;
   a data line disposed on the base substrate, the data line configured to transmit a data signal and having a multi-layer structure including at least three conductive layers stacked one on another, the three conductive layers comprising:
      a lower conductive layer disposed on the base substrate;
      an intermediate conductive layer disposed on the lower conductive layer and comprising copper and aluminum; and
      an upper conductive layer disposed on the intermediate conductive layer and comprising copper; and
   a pixel driven in response to the data signal from the data line.

2. The display apparatus of claim 1, wherein the intermediate conductive layer further comprises at least one of magnesium, nickel, or cobalt.

3. The display apparatus of claim 1, wherein a weight ratio of copper to aluminum in the intermediate conductive layer is in a range from 95:5 to 85:15.

4. The display apparatus of claim 3, wherein an average diameter of crystals in the upper conductive layer decreases as the weight ratio of aluminum increases.

5. The display apparatus of claim 4, wherein the average diameter is in a range from about 250 nanometers to about 350 nanometers.

6. The display apparatus of claim 1, wherein the lower conductive layer has an adhesive force greater than an adhesive force of each of the intermediate conductive layer and the upper conductive layer with respect to a material containing silicon.

7. The display apparatus of claim 6, wherein the lower conductive layer comprises at least one of titanium, tantalum, or molybdenum.

8. The display apparatus of claim 1, wherein the intermediate conductive layer has a thickness of about 10 nanometers to about 50 nanometers.

9. The display apparatus of claim 8, wherein the data line has a surface resistance in a range from about 45 m$\Omega$/cm$^2$ to about 55 m$\Omega$/cm$^2$.

10. The display apparatus of claim 1, further comprising:
    a gate line disposed on the base substrate and insulated from the data line, the gate line configured to transmit a gate signal; and
    a thin film transistor electrically connected to the gate line, the data line, and the pixel, the thin film transistor configured to switch the data line applied to the pixel in response to the gate signal from the gate line, wherein each of the gate line and an electrode of the thin film transistor has the multi-layer structure.

11. The display apparatus of claim 10, further comprising:
    an opposite substrate facing the base substrate;
    a common electrode disposed on at least one of the base substrate or the opposite substrate; and
    a liquid crystal layer interposed between the base substrate and the opposite substrate, and
    wherein the pixel comprises a pixel electrode.

12. The display apparatus of claim 10, wherein the pixel further comprises:
    a first electrode electrically connected to the thin film transistor;
    an organic light emitting layer disposed on the first electrode; and
    a second electrode disposed on the organic light emitting layer.

13. A method of manufacturing a display apparatus, comprising:
    forming a data line on a base substrate, the forming comprising:
       forming a lower conductive layer on a base substrate;
       forming an intermediate conductive layer on the lower conductive layer, the intermediate conductive layer containing copper and aluminum; and
       forming an upper conductive layer on the intermediate conductive layer, the upper conductive layer containing copper; and
    forming a pixel electrically connected to the data line.

14. The method of claim 13, wherein a weight ratio of copper to aluminum in the intermediate conductive layer is in a range from about 95:5 to 85:15.

15. The method of claim 14, wherein the intermediate conductive layer further comprises at least one of magnesium, nickel, or cobalt.

16. The method of claim 13, wherein an average diameter of crystals in the upper conductive layer is reduced by the intermediate conductive layer when the upper conductive layer is formed on the intermediate conductive layer.

17. The method of claim 13, wherein a number of the crystals grown increases in the upper conductive layer by the intermediate conductive layer when the upper conductive layer is formed on the intermediate conductive layer.

18. The method of claim 13, wherein the lower conductive layer comprises at least one of titanium, tantalum, or molybdenum.

19. The method of claim 13, wherein the intermediate conductive layer has a thickness of about 10 nanometers to about 50 nanometers.

20. The method of claim 13, further comprising:
    forming a gate line on the base substrate, such that the gate line is insulated from the data line; and forming a thin film transistor electrically connected to the gate line, the data line, and the pixel, wherein the data line has a multi-layer structure of the lower conductive layer, the intermediate conductive layer, and the upper conductive layer, the lower, intermediate and upper conductive layers sequentially stacked one on another, and wherein each of the gate line and an electrode of the thin film transistor has the multi-layer structure.

* * * * *

UNITED STATES PATENT AND TRADEMARK OFFICE
CERTIFICATE OF CORRECTION

PATENT NO.         : 9,093,410 B2
APPLICATION NO.    : 14/041969
DATED              : July 28, 2015
INVENTOR(S)        : Sung-Hwan Choi Page 1 of 1

It is certified that error appears in the above-identified patent and that said Letters Patent is hereby corrected as shown below:

In the specification,

At column 3, line 53, please delete "51" and insert --S1,--, therefor.

At column 3, line 59, please delete "51" and insert --S1--, therefor.

At column 3, line 61, please delete "51" and insert --S1--, therefor.

Signed and Sealed this
Twenty-ninth Day of March, 2016

Michelle K. Lee
*Director of the United States Patent and Trademark Office*